(12) United States Patent
Shibata

(10) Patent No.: US 7,384,863 B2
(45) Date of Patent: Jun. 10, 2008

(54) SEMICONDUCTOR DEVICE AND METHOD FOR MANUFACTURING THE SAME

(75) Inventor: Kazutaka Shibata, Kyoto (JP)

(73) Assignee: Rohm Co., Ltd., Kyoto-shi (JP)

( * ) Notice: Subject to any disclaimer, the term of this patent is extended or adjusted under 35 U.S.C. 154(b) by 37 days.

(21) Appl. No.: 10/795,994

(22) Filed: Mar. 10, 2004

(65) Prior Publication Data

US 2004/0169286 A1 Sep. 2, 2004

Related U.S. Application Data

(62) Division of application No. 10/088,163, filed on Mar. 15, 2002, now Pat. No. 6,734,556.

(51) Int. Cl.
*H01L 21/44* (2006.01)
(52) U.S. Cl. .............................. 438/614; 257/E23.162
(58) Field of Classification Search ................ 257/737, 257/777
See application file for complete search history.

(56) References Cited

U.S. PATENT DOCUMENTS

| 4,592,887 | A | * | 6/1986 | Bando et al. ............... 264/337 |
| 4,875,617 | A | | 10/1989 | Citowsky |
| 5,346,857 | A | | 9/1994 | Scharr et al. |
| 5,421,507 | A | * | 6/1995 | Davis et al. ............... 228/194 |
| 5,611,481 | A | * | 3/1997 | Akamatsu et al. ..... 228/180.22 |
| 5,629,566 | A | | 5/1997 | Doi et al. |
| 5,796,591 | A | * | 8/1998 | Dalal et al. ................. 361/779 |
| 5,864,178 | A | * | 1/1999 | Yamada et al. ............. 257/737 |

(Continued)

FOREIGN PATENT DOCUMENTS

DE    195 31 158    2/1997

(Continued)

OTHER PUBLICATIONS

Debabrata 'Dev' Gupta, "Evaluation of Alternative Process for Au-Sn-Au Flip Chip Bonding of Power Devices", The International Journal of Microcurcuits and Electronic Packaging, vol. 19, No. 3, 1996 (ISSN 1063-1674), XP 000639489, US, pp. 245-252.

(Continued)

*Primary Examiner*—Evan Pert
*Assistant Examiner*—Ben P Sandvik
(74) *Attorney, Agent, or Firm*—Rabin & Berdo, P.C.

(57) ABSTRACT

In a disclosed COC type semiconductor device, a bump electrode (21) of a second semiconductor chip (2) is joined to a first semiconductor chip (1) having a bump electrode (11) formed thereon. The bump electrodes (11) and (21) of the respective first and second semiconductor chips (1) and (2) are both made of first metal such as Au having a relatively high melting point, while a joining portion of these bump electrodes (11) and (21) is formed of an alloy layer (3) of the first metal and second metal, which second metal is made of such a material that can melt at a lower temperature than the melting point of the first metal to be alloyed with it. As a result, in the COC type semiconductor device, when interconnecting a plurality of semiconductor chips, their electrode terminals can be joined to each other without deteriorating the properties of these chips owing to the high temperature applied thereon.

3 Claims, 9 Drawing Sheets

U.S. PATENT DOCUMENTS 5,930,597 A * 7/1999 Call et al. .................. 438/106
6,121,689 A    9/2000 Capote et al.

FOREIGN PATENT DOCUMENTS

| | | |
|---|---|---|
| DE | 19640192 A1 | 4/1998 |
| EP | 0 662 837 | 11/1994 |
| EP | O766310 A2 | 4/1997 |
| JP | 2-159047 | 6/1990 |
| JP | 03-276750 | 12/1991 |
| JP | 03276750 | 12/1991 |
| JP | 9-8046 | 1/1997 |
| JP | 9-213702 | 8/1997 |
| JP | 9-326465 | 12/1997 |
| JP | 10-321671 | 12/1998 |
| JP | 2000-243785 | 9/2000 |

OTHER PUBLICATIONS

Christine Kallmayer et al., "Fluxless Flip-Chip Attachment Techniques Using the Au/Sn Metallurgy", IEEE/CPMT Int'l Electronics Manufacturing Technology Symposium, 0-7803-2037-9/95, Germany, pp. 20-28.

Patent Abstract of Japan Summary for publication 09-102514, published Apr. 15, 1997.

* cited by examiner

Sn CONCENTRATION

LIQUID PHASE DIFFUSION

SOLID PHASE DIFFUSION

SEMICONDUCTOR DEVICE AND METHOD FOR MANUFACTURING THE SAME

This is a Divisional of U.S. application Ser. No. 10/088,163, filed Mar. 15, 2002 now U.S. Pat. No. 6,734,556.

FIELD OF THE INVENTION

The invention relates to a so-called chip-on-chip (hereinafter abbreviated as COC) type semiconductor device, in which a plurality of semiconductor chips is electrically interconnected as opposed to each other, and a method for manufacturing the same. More particularly, the invention relates to a semiconductor device having such a construction that two mutually opposed semiconductor chips thereof can be joined to each other without being damaged due to a high temperature applied thereon or mechanical shock by supersonic waves when they are connected to each other and a method for manufacturing the same.

BACKGROUND ART

Conventionally, there has in some cases been used a so-called a COC (chip on chip) type semiconductor device having a construction of composing a semiconductor circuit of a plurality of chips by interconnecting them one on the other for a purpose of, for example, reducing an occupied area by means of three-dimensioning or standardizing part of the circuit (for example, changing driver circuits based on application by standardizing the memory portions), if the semiconductor device is composed of a plurality of circuits like in the case of a combination of memory portions and the corresponding driver circuits.

As shown, for example, in FIG. 17 showing a process of joining two semiconductor chips 1 and 2, a semiconductor device having the above-mentioned construction is fabricated by fixing the one semiconductor chip 1 on a heated board stage 51 and the other semiconductor chip 2 to a mount head 52, pressing the mount head 52 to permit bump electrodes 11 and 21 made of Au etc. of the respective chips to come in contact with each other under pressure, and heating it to a temperature of 450° C. or so to interconnect these bump electrodes 11 and 21 electrically. Note here that, as mentioned above, the bumps 11 and 21 are made of a metal material such as Au having a higher melting point than solder because the semiconductor device is mounted on the mother board by soldering.

Since the above-mentioned COC type semiconductor device employs high melting point metal such as Au as the material of its bump electrodes, to interconnect a plurality of semiconductor chips thereof, it is necessary to heat them to a temperature of 450° C. or so under pressure in order to obtain good electrical interconnection. When the chips are heated to such a high temperature during interconnection, the semiconductor substrate is also heated to a temperature of 450° C. or higher, so that the circuit elements formed in the semiconductor substrate (elements such as transistors constituting the semiconductor device) are heated to a high temperature, thus fluctuating in properties, which is a problem. Further, although these chips can be joined to each other at a temperature of 450° C. or so, if under pressure as mentioned above, for example, once joined to each other, they cannot be separated without being destroyed in most cases because Au has a high melting point.

In view of the above, it is an object of the present invention to provide such a COC type semiconductor device and a method for manufacturing the same that has a construction which is capable of interconnecting the electrodes of semiconductor chips without being affected by a temperature at which the semiconductor device is mounted and also without deteriorating the properties of the semiconductor chips owing to a high temperature applied thereon.

It is another object of the present invention to provide a semiconductor device having a construction which is capable of securely connecting a bump electrode of a semiconductor chip, even if small, to a partner semiconductor chip.

It is a further object of the present invention to provide a semiconductor device having a construction which is capable of securely connecting each other in the event that one is a wiring.

It is a still further object of the present invention to provide a semiconductor device having a construction which is capable of securely interconnecting a parent chip and a child chip and separating from each other easily without affecting elements in the semiconductor chips when the child chip is removed.

It is an additional object of the present invention to provide a semiconductor chip having such a construction that avoids force from being concentrated on the bump electrode at a joining portion so that the element formed in a semiconductor layer underlying the joining portion may not be affected adversely.

It is another additional object of the present invention to provide a semiconductor manufacturing method which is capable of joining the bump electrodes at a relatively lower temperature and also easily without accurate alignment thereof.

DISCLOSURE OF THE INVENTION

A semiconductor device according to the present invention includes; a first semiconductor chip having an electrode terminal, a second semiconductor chip having an electrode terminal, a bump electrode made of a first metal for joining the first and second semiconductor chips, the bump electrode being provided on at least one of the electrode terminal of the first semiconductor chip and the electrode terminal of the second semiconductor chip, and an alloy layer formed on a joining portion where the first and second semiconductor chips are joined with each other via the bump electrode, the alloy layer being made of an alloy of the first metal and a second metal, wherein the second metal is made of such a metal that can melt at a temperature lower than a melting point of the first metal and be alloyed with the first metal.

The first or second metal referred to here includes not only pure metal but also an alloy and composite metal made of at least two kinds of metal as well as main metal on the outer layer side in a case of a stack containing at least two kinds of metal. Also, an alloy layer of the first and second metal includes an entirely alloy layer as well as such a layer that part thereof is an alloy and the other part is made of only the first or second metal or any other compound. Further, the constructions of joining via the bump electrode include a construction in which one bump electrode and another are joined to each other or another in which a bump electrode is provided to the electrode terminal of one semiconductor chip so that it may be directly joined to the electrode terminal of the other semiconductor chip therethrough.

By employing such a construction, it is possible to electrically interconnect first and second semiconductor chips by joining their respective electrode terminals at a relatively low temperature by melting the second metal having a relatively low melting point to alloy it with the first metal which the bump electrode is made of. As a result, the bump electrode can be connected at a low heating temperature almost equal to the melting point of the second metal, so that by selecting, for example, Sn as the material of the second metal, it is unnecessary to apply such a heating temperature that may affect the circuit elements, thus avoiding adverse effects on these elements owing to a high temperature. Moreover, the first metal that makes up the major part of the bump electrode has a relatively high melting point and, therefore, causes no trouble at around the soldering temperature during mounting.

According to another aspect of the semiconductor device of the present invention includes; a first semiconductor chip having an electrode terminal, a second semiconductor chip having an electrode terminal, a bump electrode made of a first metal for joining the first and second semiconductor chips, the bump electrode being provided on at least one of the electrode terminal of the first semiconductor chip and the electrode terminal of the second semiconductor chip, and a third metal layer having a lower melting point than that of the first metal provided on a joining portion where the first and second semiconductor chips are joined with each other via the bump electrode. That is, rather than directly forming an alloy with the bump electrode or the electrode terminal, by providing, for example, the third metal layer having a low melting point such as the alloy formed by the first and second metal, the third metal layer melts at a relatively low temperature and diffuses into the bump electrode or the electrode terminal to thereby provide diffusive joining.

Note here that like the above-mentioned first and second metal, the third metal layer also includes not only pure metal but also an alloy etc., so that after being joined, it may be combined or alloyed with the first or second metal to have an uneven composition. In this case also, although the third metal layer has a relatively low melting point and melts readily at an elevated temperature, it is very thin and mostly supported by the first metal and, in a package, is not peeled off and, at the same time, may be easily peeled off by an external force when heated.

According to a further aspect of the semiconductor device of the present invention includes, a first semiconductor chip having an electrode terminal, a second semiconductor chip having an electrode terminal, a bump electrode made of a first metal for joining the first and second semiconductor chips, the bump electrode being provided on at least one of the electrode terminal of the first semiconductor chip and the electrode terminal of the second semiconductor chip, and a detachable material portion provided on a joining portion where the first and second semiconductor chips are joined with each other via the bump electrode, the detachable material being made of such a material that the first and second semiconductor chips can be easily separated from each other at a temperature of 280° C. to 500° C.

That is, while the bump is made of metal such as Au having a high melting point, the joining portion is joined to by such metal that melts at a lower temperature, for example, 300° C. or lower, so that the metal with a lower melting point provides a very thin layer and can hardly be peeled off at around a temperature of 300° C. but be easily peeled off by an external force at around that temperature in construction.

Specifically, in such a construction that the bump electrode is formed on the electrode terminal of each of the first and second semiconductor chips, and such a construction that the bump electrode is formed on the electrode terminal of either one of the first and second semiconductor chip so that a metal film made of the first or second metal may be formed on the electrode terminal of the other semiconductor chip, the alloy layer is formed on the joining portion between these bump electrodes or between the bump electrode and the electrode terminal respectively. Also, at least one of the bump electrodes is made of the first metal, so that it can be alloyed with the second metal provided on the right and side face of the bump electrode to thereby joined to via an alloy layer, or joined to via the third metal layer. And they are joined securely by forming a fillet at the joining portion even with a small size of the bump electrode.

A fillet made of the alloy layer of the first and second metal or of the third metal may be formed on the joining portion between the first and second semiconductor chips, thus highly securing the joining. The fillet here refers to such a portion of the joining portion that protrudes out on the side of the side wall, including a smoothly sloped one as well as a small one protruded only in the vicinity of the joining portion.

More specifically, if the first metal consists of Au and the second metal consists of Sn, or if the third metal consists of an Au—Sn alloy, the joining portion comes to have the Au—Sn alloy, thus making it possible to connect a bump electrode only by applying a relatively low temperature of 300° C. or so, at which the circuit elements are not affected.

According to a still further aspect of the semiconductor device of the present invention includes; a first semiconductor chip having an electrode terminal or a wiring, a second semiconductor chip having an electrode terminal or a wiring, and a low-melting point metal layer provided on the surface of the wiring of at least one of the first and second semiconductor chips, wherein the first and second semiconductor chips are electrically interconnected and joined to each other via the low-melting point metal layer so that the electrode terminal or wiring is face to face each other.

In this case, the low-melting point metal layer includes a joining portion which at least partially has an alloy formed thereon due to alloying of the first and second metal or a boundary portion which is joined in a diffusive manner owing to the provision of the third metal.

To flatten the wiring surface, the wiring can be formed via a second insulating layer onto a passivation film on the semiconductor chip, thus joining the joining portion in secure contact even if the bump electrode of the joining partner semiconductor chip or even if the wiring portions are directly joined to each other without bump electrodes.

The first and second semiconductor chips are joined to each other between their respective wirings, and the low-melting point metal layer is provided on a joining portion, and further including a first insulating layer provided as interposed at a gap between the a couple of wirings except at the joining portion, thus securely interconnecting the wiring with no possible contact between the wiring provided on the outermost surface.

The wiring can be made of an Au via a barrier metal layer provided to the electrode terminal as connected thereto, and the low-melting point metal layer can be made of an Au—Sn alloy. Further the wiring can include a Cu wiring made of Cu formed simultaneously with the electrode terminal, a barrier metal layer provided on the Cu wiring, and an Au wiring provided on the barrier metal layer, wherein the low-melting point metal layer is made of an Au—Sn alloy and is provided on the Au wire. Further the wiring can be made of Au formed simultaneously with the electrode terminal, and the low-melting point metal layer can be made of an Au—Sn alloy.

By forming the Au—Sn alloy constituting the joining portion so that it may be rich in Au by containing Au by 65 weight-percent or more, an eutectic alloy can be obtained, so that the joining portion can be connected securely and still can be easily removed by heating it to a temperature of 300° C. or so because the eutectic alloy has a low melting point. Further, the joining strength can be stabilized even more if the Au—Sn alloy layer of the joining portion is 0.8 µm or more and 5 µm or less.

Also, if the gap in the joining portion between the first and second semiconductor chips is filled with an insulating resin having nearly the same elastic modulus as the bump electrode, even though a compressing force due to, for example, shrinkage of the resin package is applied on these chips, the pressure on the semiconductor layer is not concentrated to the electrode terminal portion such as the bump electrode but is dispersed all over the surfaces of the semiconductor chips and, therefore, can be absorbed evenly by the surfaces, thus improving the reliability of the device.

Also, if the gap between the first and second semiconductor chips joined each other is filled with an insulating resin layer with a thermal shrinkage factor of 4% or less, even though both semiconductor chips are adhered to each other at a temperature of 300° C. or so and then cooled down to the room temperature, they do not shrink than the electrode terminal connecting portion such as the bump electrode, so that the compressing force is not concentrated to the electrode terminal portion but is dispersed all over the surfaces of the semiconductor chips and, therefore, can be absorbed evenly by the surfaces, thus improving the reliability of the device.

Preferably, a circuit element is formed in the semiconductor layer at the joining portion of at least one of the first and second semiconductor chips, thus improving the integration density. That is, by the present invention, the chips can be joined to each other at a relatively low temperature with almost no pressure applied thereon, thus making it possible to form the circuit element even under the electrode pad or wiring joining portions.

A method for manufacturing a semiconductor device of the present invention, in which a first semiconductor chip or substrate and a second semiconductor chip are joined to each other with the surfaces thereof on which an electrode terminal or a wiring are formed respectively as facing each other via metals of the surface of the electrode terminal or the wiring, comprising the steps of; providing at least one of the metals with a low-melting point metal layer having a lower melting point than that of each of the metals, and melting the low-melting point metal layer or alloying the metals with the low-melting point metal layer to thereby join the first semiconductor chip or substrate and the second semiconductor chip to each other.

Another method for manufacturing a semiconductor device of the present invention, in which a first semiconductor chip or substrate and a second semiconductor chip are joined to each other with the surfaces thereof on which an electrode terminal or a wiring are formed respectively as facing each other via metals of the surface of the electrode terminal or the wiring, comprising the steps of; providing at least one of the metals with a low-melting point metal layer having a lower melting point than that of each of the metals, and liquefying the low-melting point metal layer to thereby diffuse the metals provided on the surface of the electrode terminal or the wiring into the liquefied low-melting point metal, by the liquid-phase diffusion method, thus joining the first semiconductor chip or substrate and the second semiconductor chip to each other.

Also, it is preferable that the metals are made of Au and the low-melting point metal layer is made of Sn or an Au—Sn alloy and also the first semiconductor chip or substrate and the second semiconductor chip are superposed one on the other with the electrode terminals or the wirings thereof as facing each other and heated to a temperature at which the Au—Sn alloy or Sn melts, to be self-aligned and joined with each other. That is, when these portion can be joined to each other by use of the Au—Sn alloy and heating them to a temperature of 280° C. or so, they melt completely and, therefore, needs no pressure application nor complete alignment, to be brought up by surface tension to the joining position such as the bump in self-alignment.

Alternatively, further including the steps of; alloying the metals provided on the surface of the electrode terminal or the wiring of one of the first and second semiconductor chips with the low-melting point metal layer provided on the surface thereof, and joining to the other of the first and second semiconductor chips or substrate.

BEST MODE FOR CARRYING OUT THE INVENTION

Figure 1A:
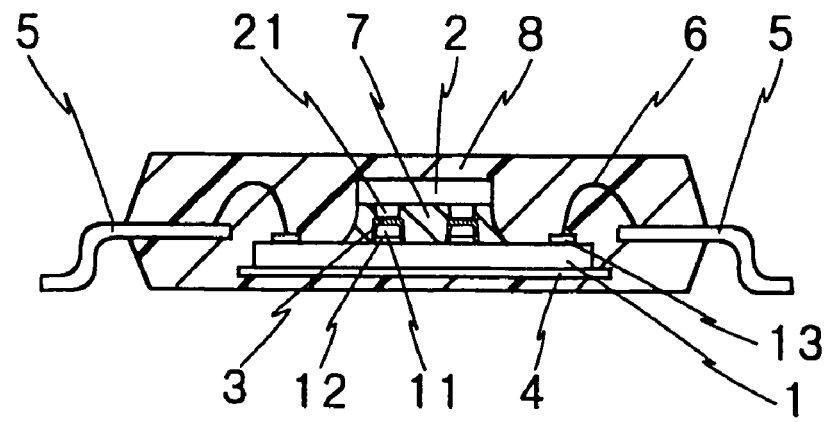
FIGS. 1A to 1C are cross-sectional views for showing one embodiment of a semiconductor device according to the present invention and side views for showing two chips before interconnecting therewith.

The following will describe a semiconductor device and method for manufacturing the same according to the present invention with reference to the drawings. As shown in FIG. 1 illustrating a cross-sectional view and a state where two semiconductor chips are yet to be joined to each other according to its one embodiment, a semiconductor device according to the present invention has such a COC type construction that onto a semiconductor chip 1 on the surface of which bump electrodes 11 are formed, bump electrodes 21 of a second semiconductor chip 2 are joined. The respective bumps electrodes 11 and 21 of these first and second semiconductor chips 1 and 2 are both made of first metal such as Au having a relatively high melting point, while a joining portion between these bump electrodes 11 and 21 is formed of an alloy layer 3 given by alloying the first metal and second metal, which second metal can melt at a temperature lower than the melting point of the first metal and be alloyed with it.

Figure 1B:
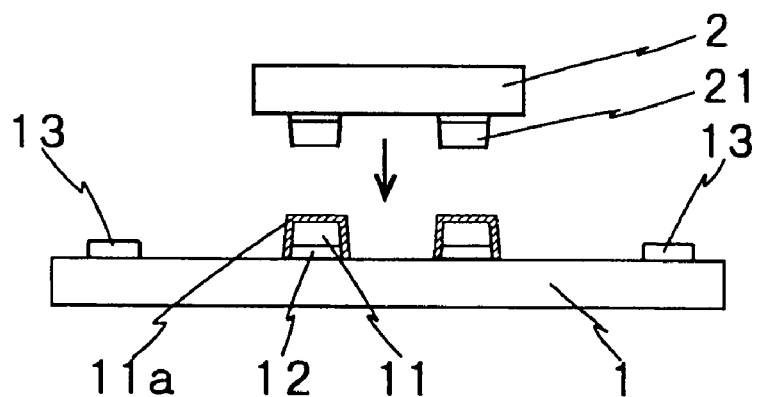
Figure 1C:
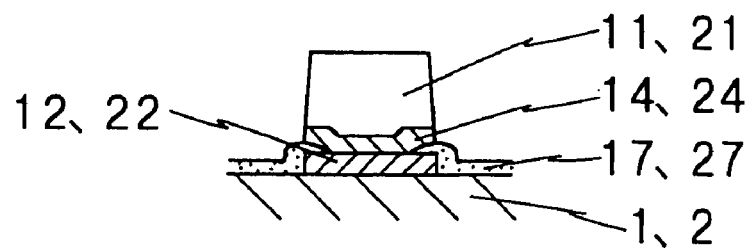

In the example shown in FIGS. 1, on both of the first and second semiconductor chips 1 and 2, the respective bump electrodes 11 and 21 are formed by plating etc. to a thickness of 10-30 μm or so, in addition to which the bump electrode 11 of the first semiconductor chip 1 is provided with Sn (second metal) formed thereon to a thickness of 0.5-3.0 μm by electroless plating or sputtering. The bump electrodes 11 and 21 themselves are formed conventionally in that, as shown in FIG. 1C illustrating the expanded cross-sectional view of the bump electrode, on the electrode terminals 12 and 22 made of aluminum are respectively formed barrier metal layer 14 and 24 in a two-layer or three-layer construction, for example, which consists of a first layer made of Ti or Cr, a second layer made of W, Pt, Ag, Cu, or Ni, and a third layer made of Au etc. Thereon are formed the bump electrodes 11 and 21 made of Au, Cu, etc. respectively. Note here that reference numerals 17 and 27 indicate an insulator film.

An Sn coating 11a is provided on the bump electrode 11 made of Au, so that at around a temperature of 230° C., Sn with a melting point of 232° C. or so melts to be alloyed with Au having a melting point of 1064° C. to thereby provide an eutectic alloy and, at around a temperature of 280° C., an alloy layer 3 made of an Au—Sn alloy is formed on the joining surface to permit both the bump electrode 11 and 21 to be melt-adhered to each other. (In case of bonding Au bump and Au bump, they are melt-adhered to each other when heated to a temperature of 450° C. or so under pressure because they are of the same metal.) That is, these bump electrodes 11 and 21 can be melt-adhered to each other at such a low temperature as not to damage the circuit elements formed on the semiconductor substrate. Therefore, any other metal than Au and Sn can be used as far as such a relationship is satisfied between the first metal making up the bump electrode 11 and the overlying second metal coating 11a that the second metal may have a lower melting point than the first metal and, therefore, the second metal can melt to thereby be alloyed with the first metal for melt-adhesion.

In the first semiconductor chip 1, for example, a memory driver circuit is formed on its semiconductor substrate, on the surface of which are provided an inter-layer insulator film and a wiring layer, on the surface of which are in turn formed the electrode terminal 12 for finally connecting with the second semiconductor chip 2 having memory circuit elements etc. and an electrode terminal 13 for connecting with an external lead. On this electrode terminal 12 is formed the bump electrode 11 via a barrier metal layer 14 as mentioned above. These circuit elements (semiconductor elements) and the wirings, electrode terminals, insulator films, etc. formed on the surface of the semiconductor substrate are manufactured by almost the same method as that for ordinary semiconductor devices. Note here that besides silicon, which is employed typically, any other compound semiconductor such as GaAs may be employed as the material of the substrate.

In the second semiconductor chip 2, on the other hand, for example, memory circuits are formed in a matrix, in such a configuration that portions connected to the driver circuit or the external lead are formed as the electrode terminal 22 on the surface of its semiconductor substrate, on the surface of which electrode terminal 22 is also formed the bump electrode 21 made of Au like in the case of the first semiconductor chip 1. This bump electrode 21 may have, if desired, an Sn coating formed thereon like in the case of the first semiconductor chip 1. Alternatively, the first semiconductor chip 1 has no Sn coating formed thereon, while the second semiconductor chip 2 may has an Sn coating formed only on the bump electrode 21. That is, it is only necessary to provide the Sn coating on at least one of these two chips.

The second semiconductor chip 2 need not be an IC but may be a transistor, a diode, a capacitor, or any other discrete component, which may be not formed on a semiconductor substrate. To fabricate a breakdown-resistant composite semiconductor device, in particular, preferably a discrete protective diode is mounted as the second semiconductor chip because it can provide a built-in large-capacitance protective element.

Figure 13A:
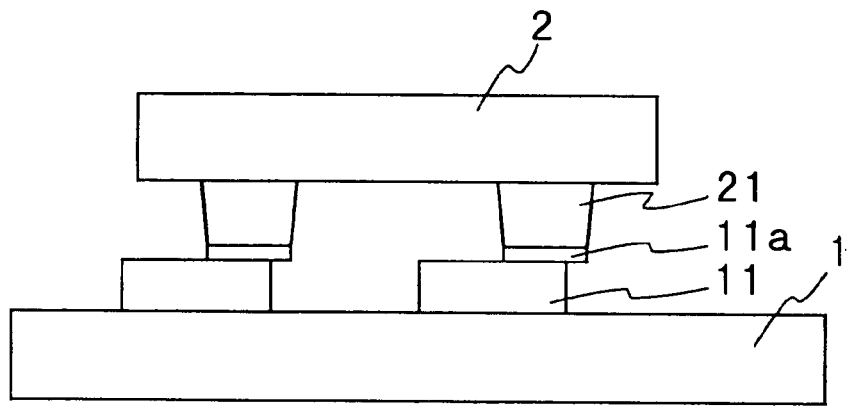
FIGS. 13A and 13B are illustrations for showing steps for interconnection in self-alignment according to the present invention.
Figure 13B:
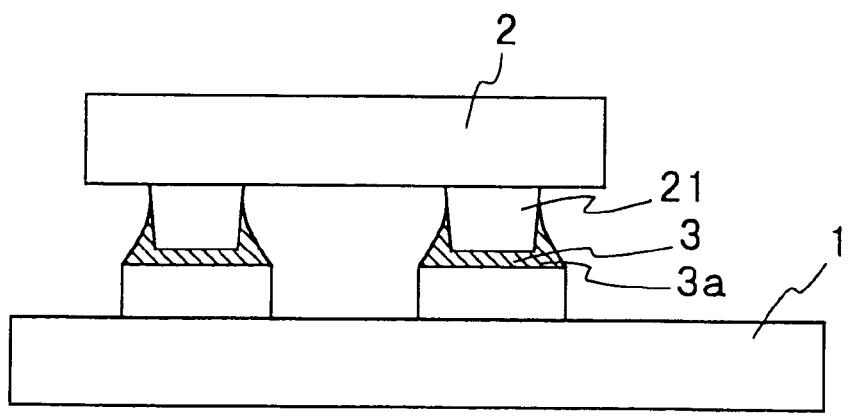

To interconnect the bump electrodes 11 and 21 of the respective first and second semiconductor chips 1 and 2, for example, the first semiconductor chip 1 is put on a substrate stage which can be heated to then superpose the second semiconductor chip 2 thereon by a mounter in rough alignment of the bumps, which is heated to a temperature of 300° C. or so while applying thereon load of around its own weight of the second semiconductor chip so that the Sn coating 11a may melt to form an eutectic with Au of the bump electrodes 11 and 21, thus forming the alloy layer 3. In this case, even if, as shown in FIG. 13A, the first and second semiconductor chips 1 and 2 are not completely aligned with each other, when the alloy layer 3 is formed at around a temperature of 300° C. to melt this alloy layer, the second chip 2 moves, as shown in FIG. 13B, by surface tension of the alloy layer 3 in such a manner that they may be joined center-to-center of bump electrodes 11 and 21 each other (self-alignment). When they are cooled then, the alloy layer 3 is solidified so that they may be adhered to each other.

This self-alignment is possible not only between one semiconductor chip and another but also between a substrate and a semiconductor chip as well, in which case low-melting point metal such as the Au—Sn alloy layer is melted. Note here that although this example has employed as the load only its own weight of the second semiconductor chip during joining, an extra some weight may preferably be added when the number of the joining portions such as bumps is large to thereby reduce the load for each of them. For example, load of 2 gram for each bump may be applied at a temperature of 350° C. in joining.

As described later, the gap between the first and second semiconductor chips 1 and 2 is filled with an insulating resin 7 made of, for example, an epoxy resin or elastomer, so that the semiconductor chips 1 and 2 joined to each other are bonded, like in the case of manufacturing of ordinary semiconductor devices, on a die island 4 made of a lead frame and connected by wire bonding to each lead 5 via a wire 6 made of gold etc. and enclosed by a resin package 8 which is molded. Then, the lead frame has its leads cut off and undergoes forming, to provide a semiconductor device having such a shape as shown in FIG. 1A.

According to the embodiment of the semiconductor device of the present invention, the electrode terminals of the respective first and second semiconductor chips are interconnected and adhered to each other by alloying the first metal of a metal film on the bump electrode or electrode terminal with the coating made of the second metal having a lower melting point than the first metal, so that they can be joined to each other at a relatively low temperature of 300° C. or so despite that the bump is made of metal such as Au having a relatively high melting point. Moreover, since they are joined to each other by alloying, the alloy layer will not melt to peel off the joined portions even when it is heated to a temperature of 260° C. or so when, for example, the semiconductor device is soldered to a circuit board. Further, since they are joined to each other at a temperature of 300° C. or so, the semiconductor elements (circuit elements) formed on a semiconductor substrate are not subject to mechanical or thermal stress, so that their properties are not affected at all. This leads to very high reliabilities of the semiconductor device.

The portion where the second metal coating is provided, on the other hand, has some residue thereof, which can, however, be easily peeled off by an external force at an elevated temperature of 300° C. or so because the coating has a smaller concentration of the first metal even in the alloyed condition. That is, at a solder reflow temperature, a very thin layer melts, if any, and is not separated because no external force is applied thereon, whereas in the case of, for example, replacement of the semiconductor chips, it can be easily separated by an external force at an elevated temperature of 300° C. or so to facilitate the replacement. Besides an Au—Sn alloy, which can be easily separated at a temperature of 300° C. or so, any other alloys may be employed as far as they can be separated at a temperature of 280-500° C. because only the joined potion needs to be heated for separation.

Figure 14A:
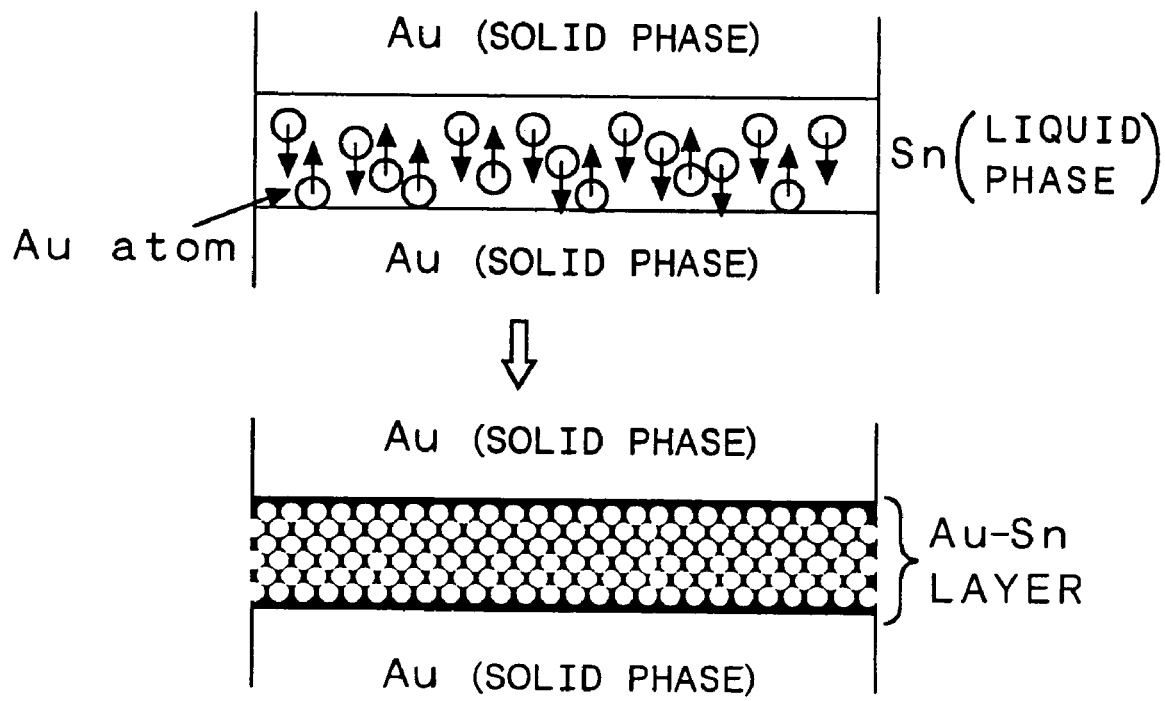
FIGS. 14A and 14B are conceptual diagrams for showing steps for liquid-phase diffusive joining method according to the present invention.
Figure 14B:
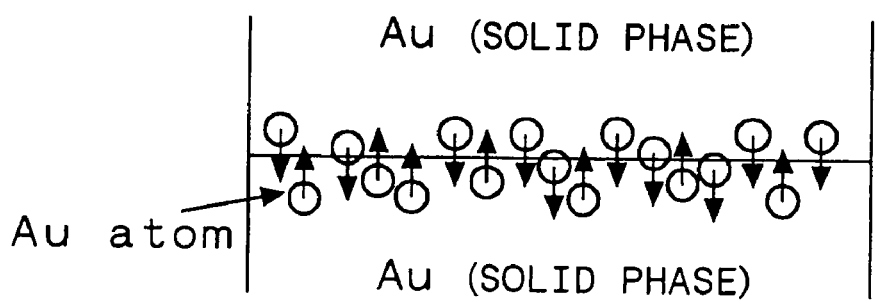

The method of joining by use of a low-melting point metal layer made of Sn etc. according to the present invention is detailed below in comparison to a related art Au—Au joining method. As shown in FIG. 14B, by the related art method of joining one Au bump and another to each other using supersonic waves, an Au bump (solid phase) and another (solid phase) diffuse into each other in solid phase diffusion. As such, the diffusion proceeds very slowly, so that these bumps cannot be joined to each other unless shocked by supersonic waves etc. According to the present invention, on the other hand, when the Au bump is coated with low-melting point metal such as Sn and heated, as shown in FIG. 14A, Sn melts at a relatively low temperature to be liquefied, so that Au diffuses into the liquid-phase Sn by liquid-phase diffusion. Accordingly, Au diffuses into each other at a relatively low temperature, so that the bumps can be joined to each other at a relatively low temperature without applying supersonic waves thereon.

This liquid-phase diffusion method is further detailed as follows. As shown in FIG. 1B again, one of the bumps is coated with low-melting point metal such as Sn to then superpose the first and second semiconductor chips one on the other with their respective joining portions being in contact with each other, which are then heated to a temperature of 350° C. with joining load of 2 gram or so applied on each of the bumps. Then, as shown in FIG. 14A, Sn is liquefied, so that Au diffuses into the liquid-phase Sn. That is, they enter a liquid-phase diffusion state and, therefore, diffuse into each other by far more rapidly than in diffusion when they are both in a solid phase. As a result, an Sn—Au alloy layer is formed as shown in the lower part of FIG. 14A. When cooled in this state, these chips are joined to each other completely.

Figure 2A:
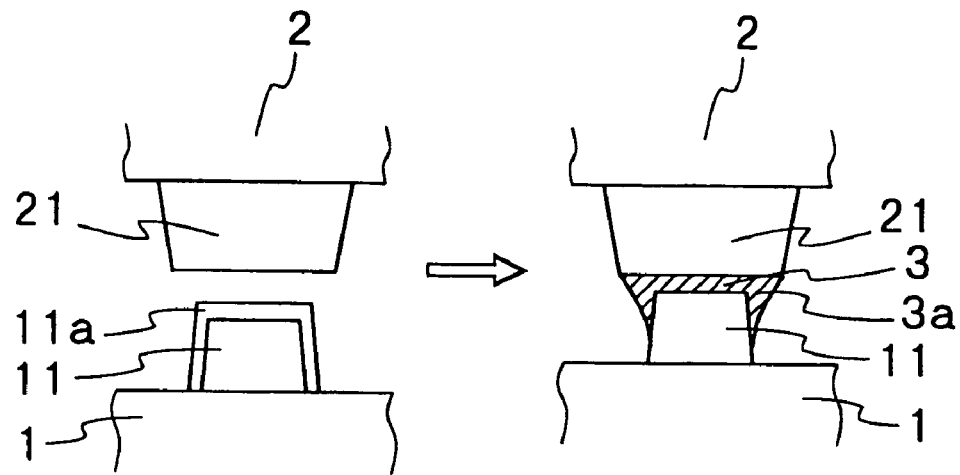
FIGS. 2A and 2B are illustrations for showing a joined state where an Sn coating is formed up to the side face of a bump electrode.
Figure 2B:
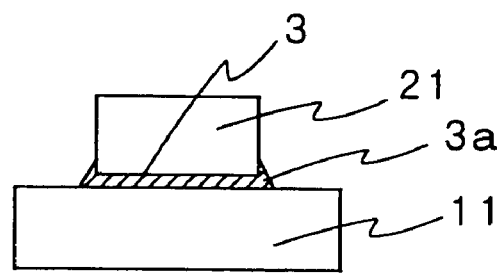

In the example shown in FIG. 1B, the second metal coating 11a is illustrated as covering also the side faces of the bump electrode 11. By thus covering the bump electrode 11 up to its whole side faces, as shown in FIG. 2A illustrating joining of the bump electrodes, even if the bump electrode 11 is small, when they are alloyed to thereby form the joining portion 3, a fillet 3a is formed from the surroundings of the small bump electrode 11 up to the larger bump electrode 21 to secure the joining. Also in a case described later with reference to FIG. 4A, by forming such a fillet 3a in joining, the joining can be made strong greatly.

Note here that the electrode pad etc. are omitted in FIG. 2A and also that the same components are indicated by the same reference numerals in FIGS. 1B and 2A. The fillet 3a here refers to such a portion of a low-melting point metal layer such as the Au—Sn alloy layer that protrudes out from the joining portion to the side walls of the bump electrode etc., which fillet 3a need not always be formed as trailing all over the side walls of one of the two bump electrodes but just needs to be formed to such an extent that the side wall of the bump 21 may be wetted by the low-melting point metal layer partially on the side of the joining portion, in order to improve the joining strength.

Figure 15:
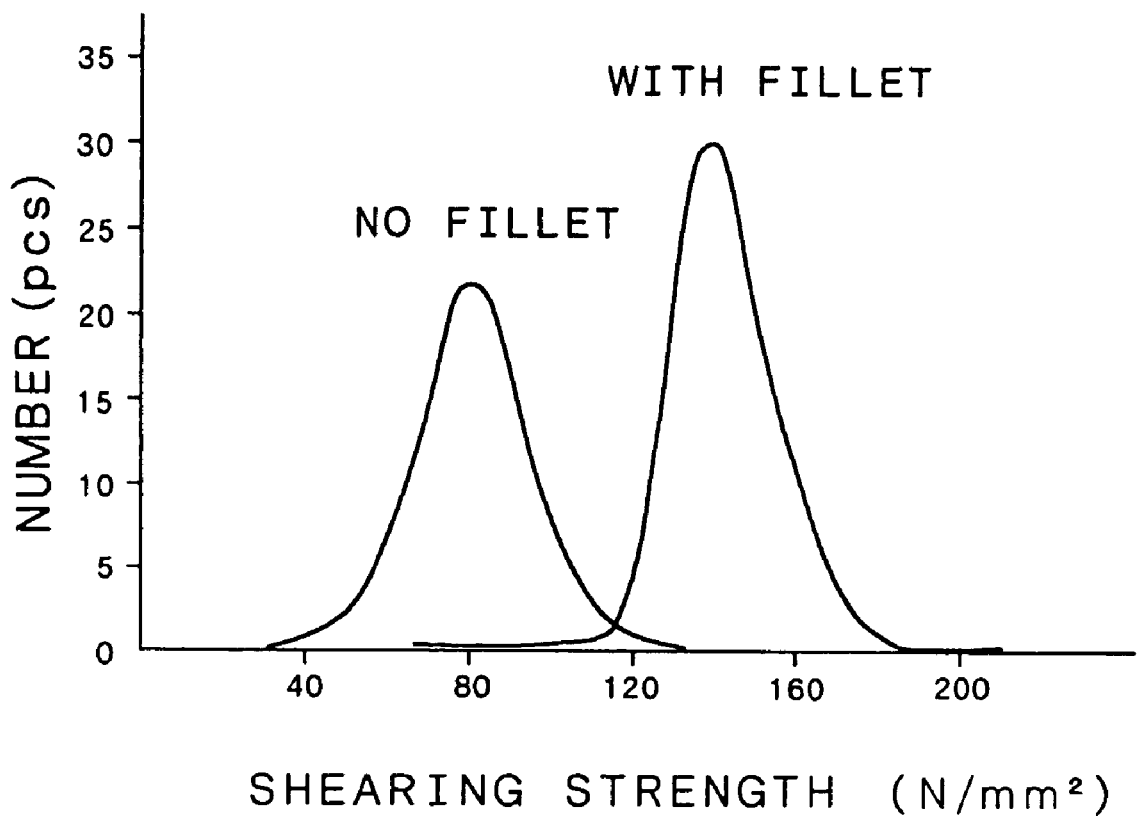
FIG. 15 is a graph for showing the joining strength in comparison of cases where a joined structure is provided with a fillet and not with it according to the present invention.

As shown in FIG. 2A, when the fillet 3a is formed as trailing greatly, as shown in FIG. 15, its joining strength was clearly observed to be improved as compared to the case where no fillet is formed. In FIG. 15, the horizontal axis represents the shearing strength ($N/mm^2$) and the vertical axis, the number of articles n (pcs). This fillet may be formed not only at the above-mentioned Au—Sn layer but also at the layer where the first metal is alloyed with the second or third metal.

Figure 3:
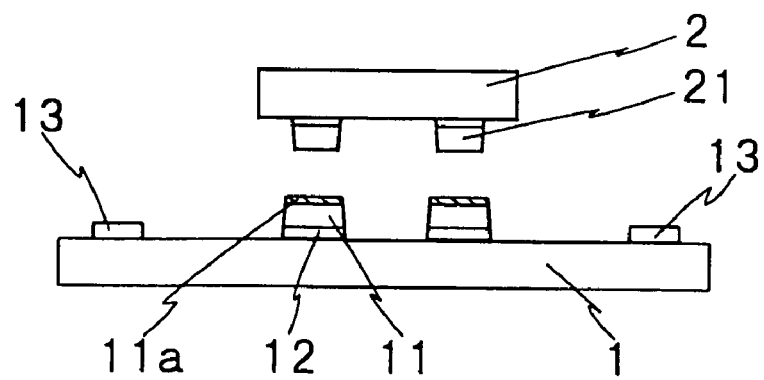
FIG. 3 is a cross-sectional view for showing a variant of the embodiment of FIG. 1B.
Figure 4A:
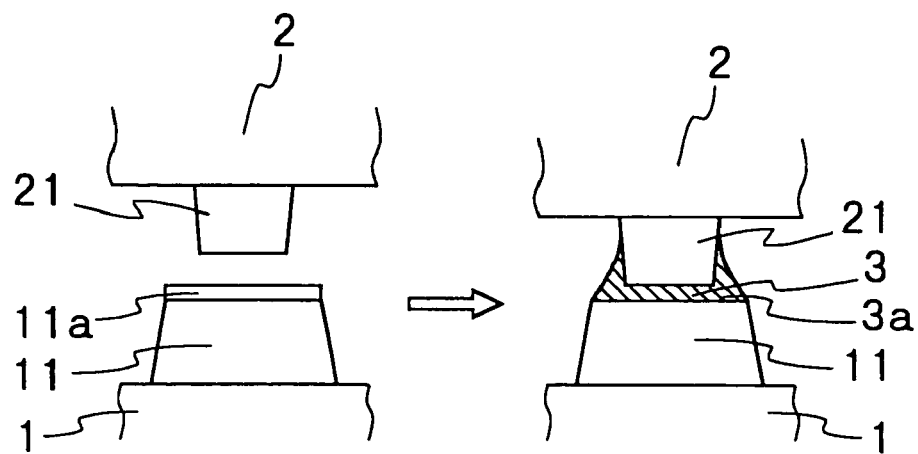
FIGS. 4A and 4B are illustrations for showing an interconnection example where an Sn coating is formed on one of the bump electrodes.
Figure 4B:
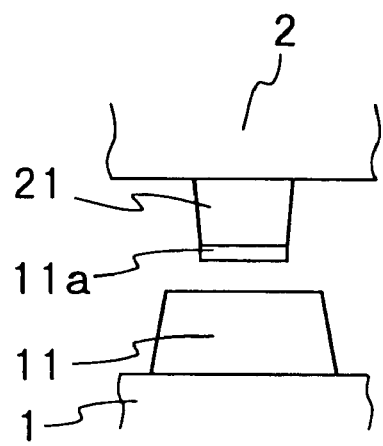

If the bump electrodes are both large sufficiently or the second semiconductor chip may be dismounted highly possibly, the Sn coating need not be formed on the side faces of the bump electrode 11 but needs to be formed only on the right surface, that is, the joining surface as shown in FIG. 3. Note here that the same components are indicated by the same reference numerals in FIGS. 3 and 1B. In this case, if the two semiconductor chips once joined to each other may not possibly be dismounted and their bump electrodes have a difference in size, as shown in FIG. 4A, by forming the Sn coating 11a on the larger bump electrode 11, the fillet 3a is formed to enhance the adhesive strength as shown in the right side of the figure, while by forming the Sn coating 11a on the smaller bump electrode 21, on the other hand, the adhesive strength can be weakened so that the chips can be dismounted easily.

Further, as indicated in the above-mentioned examples, preferably the Sn coating 11a is formed only one of the bump electrodes 11 and 21, to easily form an alloy layer on the joining surface. That is, since the Au and Sn portions are alloyed with each other in mutual contact for joining, if the Sn coating is provided on both bumps, these two Sn coatings are not readily joined to each other when they came in mutual contact in that first the Au layer and the Sn coating on the respective bump electrodes are alloyed with each other when they came in mutual contact and then Au diffuses into the joining portion to be alloyed with it for joining, so that preferably the Au layer and the Sn coating are formed so that they may be in contact with each other. Alternatively, however, an Sn coating may be formed on both bump electrodes but very thin so that Au can be diffused readily.

Further, supposing the first metal to be Au and the second metal to be Sn, the above-mentioned alloy layer, if alloyed in a completely eutectic manner, has a composition of 80 weight-percent of Au and 20 weight-percent of Sn, which however is not heated sufficiently during joining, so that the joining portion hardly provides a complete eutectic alloy. Even if it does not provide a complete eutectic alloy, however, the joining portion can have a secure joining strength as far as it has at least 64 weight-percent of Au and can be separated alone when heated to a temperature of 300° C. or so. Also, preferably no alloy layer is formed but an Au layer alone, to enhance the mechanical strength.

Figure 5:
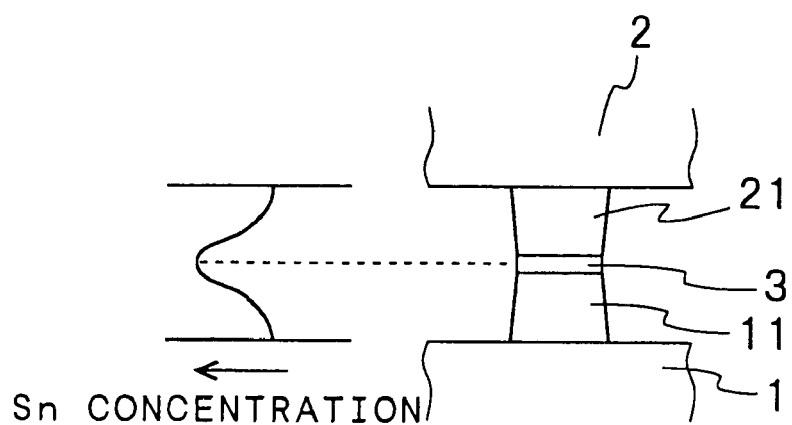
FIG. 5 is an illustration for showing a concentration distribution of Sn in a joined state where an Sn coating is provided on the surface of an Au bump electrode.

Since Au diffuses almost 10 times as much as Sn, the Sn concentration over the bump electrodes 11 and 21 and the joining portion 3 after joining is distributed, as shown in FIG. 5, highest at the center of the joining portion where the Sn coating 11a is provided and lower gradually toward the root of the bump electrodes 11 and 21. Therefore, preferably the Sn coating thickness and the joining time and temperature are adjusted so that the Au concentration is at least 65 weight-percent even at the point where the Sn concentration hits the peak and 100 weight-percent at the root of the bump electrodes 11 and 21. Note here that the Au concentration is meant to be, for example, at least 65 weight-percent not all over the bump electrode surfaces but just over at least 60% of the whole area because the electrodes are not in a complete steady state. The joining time and temperature and the Sn layer thickness can be adjusted so that, for example, the Au concentration is at least 65 weight-percent at such a joining portion, still leaving a point where the Au concentration is 100 weight-percent.

More preferably, the Au—Sn eutectic layer (joining portion 3) is at least 0.8 μm and 5 μ or less in thickness. To this end, the Sn coating must be 0.1 to 4.0 μm in thickness. In this case, to leave a complete Au layer as is, the Au layer (bump electrode) must be formed thick.

Although the example shown in FIGS. 1A to 1C has the bump electrodes 11 and 21 formed on the electrode terminals of the first and second semiconductor chips 1 and 2 respectively, the bump electrode only needs to be formed on at least one of these electrode terminals as far as it is positioned at the interconnection or may be joined to the electrode terminal. This case is exemplified in FIG. 6, which shows an expanded cross-sectional view of only the interconnection. That is, on the connection electrode terminal 12 of the first semiconductor chip 1, instead of a bump electrode, a metal film (Au film) 15 made of, for example, Au with a thickness of 0.2 to 0.5 μm is provided via the barrier metal layer 14, on which a second metal coating (Sn coating) 16 is provided to the same thickness as the Au film 15. On the second semiconductor chip 2, on the other hand, the bump electrode 21 made of Au is formed in almost the same manner as above, in such a construction that the bump electrode 21 is alloyed with the Sn coating 16 to thereby be melt-adhered to the Au film 15 overlying the electrode terminal 12. This Sn coating 16 may be provided on the side of the bump electrode 21 of the second semiconductor chip 2 or on both sides and connected with them in the same way as the above.

Figure 6:
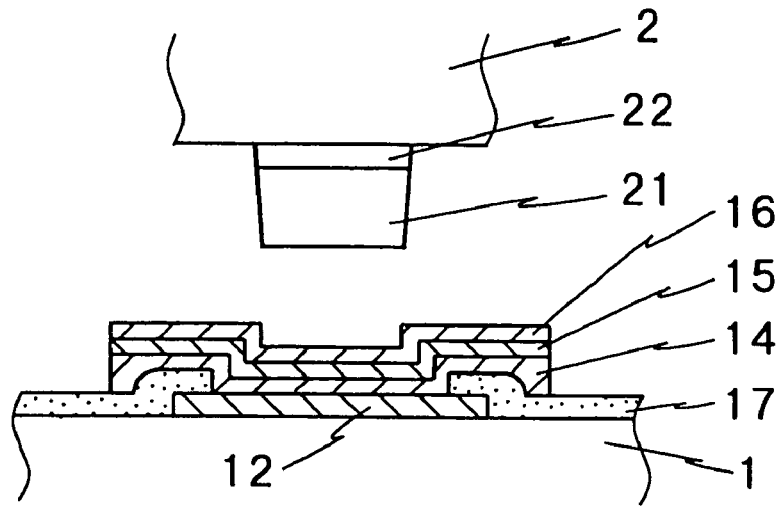
FIG. 6 is a cross-sectional view for showing another embodiment of the semiconductor device of the present invention.
Figure 7:
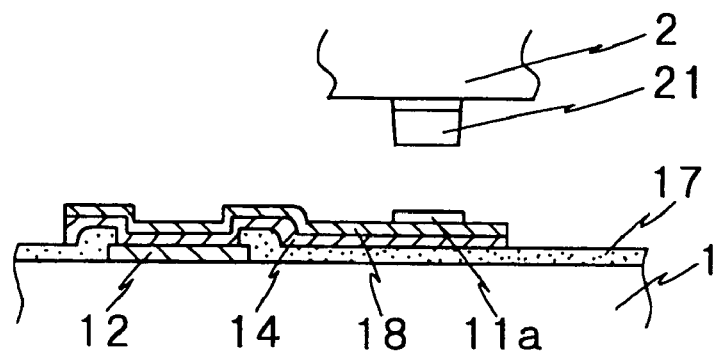
FIG. 7 is a cross-sectional view for showing a main part of still another embodiment of the semiconductor device of the present invention.

In contrast to the above-mentioned examples, in which the first and second semiconductor chips are interconnected between their respective electrode terminals, according to this embodiment of the present invention, by providing the surface of the first metal with a coating of the second metal that can be alloyed with the first metal at a relatively low temperature and heating them, they can be alloyed with each other for joining, so that these chips can directly be joined to each other through the exposed portion of wiring. That is, as shown in FIG. 7, when a wiring 18 made of Au is formed as connected to the electrode terminal 12 made of Al etc. via the barrier metal layer 14 having a Ti/W stack structure, the Sn coating 11a can be formed at the joining portion on the Au wiring 18 and abutted against the bump electrode 21 of the second semiconductor chip 2 in contact therewith to be then heated to a temperature of 300° C. or so for joining. Note here that the barrier metal layer 14 serves to prevent the Al electrode terminal 12 from being oxidized so that it may be connected with the Au wiring 18 at a low resistance. In FIGS. 6 and 7, the same components are indicated by the same reference numerals and, therefore, their explanation is omitted.

Figure 8:
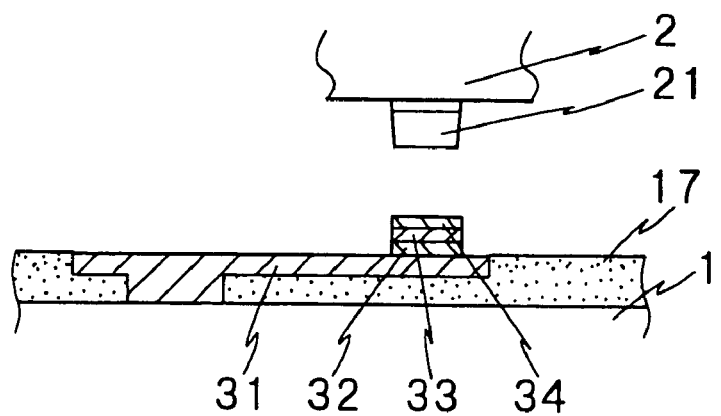
FIG. 8 is a cross-sectional view for showing a main part of a further embodiment of the semiconductor device of the present invention.

To join the chips through the wiring portion, in place of the Au wiring 18 shown in FIG. 7, an Al or Cu wiring may be formed in some cases. In such a case also, the joining portion of, for example, an Al wiring, can be provided with the barrier metal layer, the Au layer, and the Sn coating as shown in FIG. 7 to thereby join the chips easily. In the case of a Cu wiring, on the other hand, as shown in FIG. 8, on a Cu wiring 31, only the joining portion can be provided with a barrier metal layer 32 made of Ti/W or Ni by plating and, thereon, with an Sn coating 34 to thereby be joined with the second semiconductor chip 2 having the bump electrode 21 made of Au as mentioned above. Note here that the barrier metal layer 32 is provided to improve joining between the Au layer 33 and the Cu wiring 31.

Although the above-mentioned examples have formed the bump electrode 21 always on the side of the second semiconductor chip 2, the second semiconductor chip 2 may also be provided with a wiring portion for interconnection. In this case also, although different wiring materials have different stack structures, the surface can be provided with a contact portion between the Au film and the Sn coating via a necessary barrier metal layer etc. to thereby join the semiconductor chips 1 and 2 to each other like in the case of the above-mentioned examples.

Figure 9:
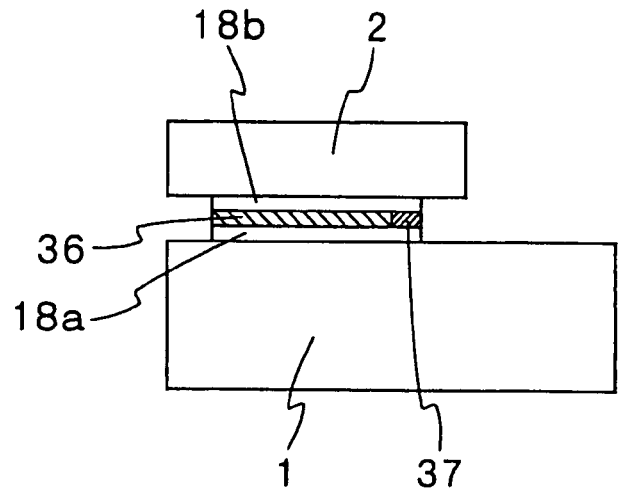
FIG. 9 is an illustration for showing an example of joining wiring portions to each other in the semiconductor device according to the present invention.

That is, as shown in FIG. 9, by forming an Sn coating on part of the surface of a wiring 18a of the first semiconductor chip 1 and a wiring 18b of the second semiconductor chip 2 (which are formed on the outermost surface of the passivation film of these semiconductor chips respectively) and, on the other parts, a first insulating layer 36 made of, for example, polyimide or $SiO_2$, a joining portion 37 can be formed only at a portion where the Sn coating is given to thereby interconnect these chips.

In this construction, the wiring layer made of Au is formed thinner than a bump layer so that highly possibly a portion made of only the Au layer into which no Sn is diffused after joining may not be formed; however, this construction need not forming a bump electrode to reduce the man-power requirements and also eliminates a problem that only the joining portion is stressed because the chips are joined to each other through the insulating layer 36. However, in such a case of interconnection between wirings also, the chips may be joined to each other not through the insulating layer 36 but through only the joining portion like in the case of the above-mentioned interconnection between the bump electrodes, with the gap therebetween being filled with an insulating resin as described later.

Figure 10:
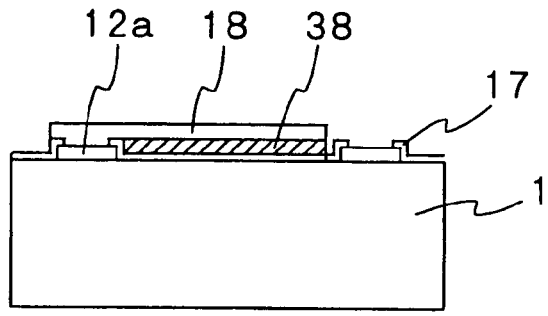
FIG. 10 is an illustration for showing an example of flattening the wiring portion which is joined in the semiconductor device according to the present invention.

Further, in an interconnection construction that at least one of the joining portions is made of a wiring, as shown in FIG. 10, there is a step in level between an electrode pad 12a and an insulator film (passivation film) 17, so that a wiring formed thereon is not flat, thus giving rise to a problem of difficulty in joining of the chips. To solve this problem, as shown in FIG. 10, a second insulating layer 38 made of, for example, polyimide can be formed on the insulator film 17 to then form the wiring 18 thereon, in order to flatten the wiring 18, thus giving a merit of facilitating joining.

Figure 11:
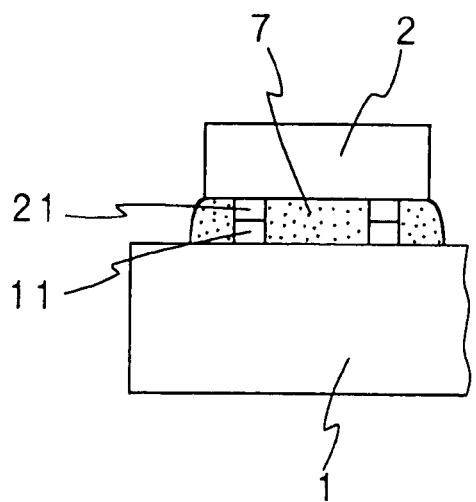
FIG. 11 is an illustration for showing an example of filling an insulating resin in a gap between semiconductor chips of the semiconductor device according to the present invention.

As shown in FIG. 1 again, preferably the gap between the first and second semiconductor chips 1 and 2 is filled with an insulating resin. That is, after the first and second semiconductor chips 1 and 2 are joined to each other, the insulating resin made of polyimide etc. is dropped into the gap formed therebetween and then hardened to thereby form the underfill (insulating resin layer) 7, as shown in FIG. 11. Such an underfill 7 can be formed to bring these chips in contact with each other over the entire surfaces thereof, thus eliminating a problem that the element formed in a semiconductor layer underlying the bump electrode are damaged. That is, during packaging the semiconductor chips with a mold resin, the mold resin cannot easily go into the gap between the semiconductor chips. The gap not filled with it causes the resin package 8 to press these semiconductor chips, so that the resultant pressure must be absorbed only by the bump electrode, to give rise to the above-mentioned problem, to solve which problem the underfill 7 can be provided.

In this case, preferably polyimide (having an elastic modulus of 4.5 GPa) is employed because its elastic modulus is almost equal to that of Au. Since the elastic modulus of the underfill 7 is almost equal to that of the bump electrodes 11 and 21, even after the bump electrodes are melt-adhered and then cooled, the compressive force is evenly applied on and therefore dispersed over the bump electrodes and the other portions of the semiconductor chips, so that it is possible to support the bump electrodes as well as the second semiconductor chip 2 by a surface, thus avoiding a special force from being applied only on the bump electrodes.

Further, preferably the resin employed as the material of the underfill 7 has a thermal shrinkage factor (thermal expansion coefficient) of 4% or less. With a larger value of the thermal shrinkage factor, when the underfill 7 is cooled from the temperature of about 300° C. at the time of hardening down to the room temperature, it shrinks more than the bump electrode made of Au, so that the compressive force is applied only on the bump electrodes, thus damaging the underlying semiconductor layer more.

Although the above-mentioned examples have joined the interconnection portions to each other via the bumps by joining and alloying the first metal with a relatively high melting point and the second metal with a relatively low melting point with each other, such third metal such as, for example, an Au—Sn alloy that melts at a temperature of 300° C. or so can be provided on that joining surface and then melted for joining. This is exemplified in FIG. 12, which shows, like FIG. 6, only the bump electrode as expanded. The third metal may be an Au—Sn alloy etc. described later.

Figure 12:
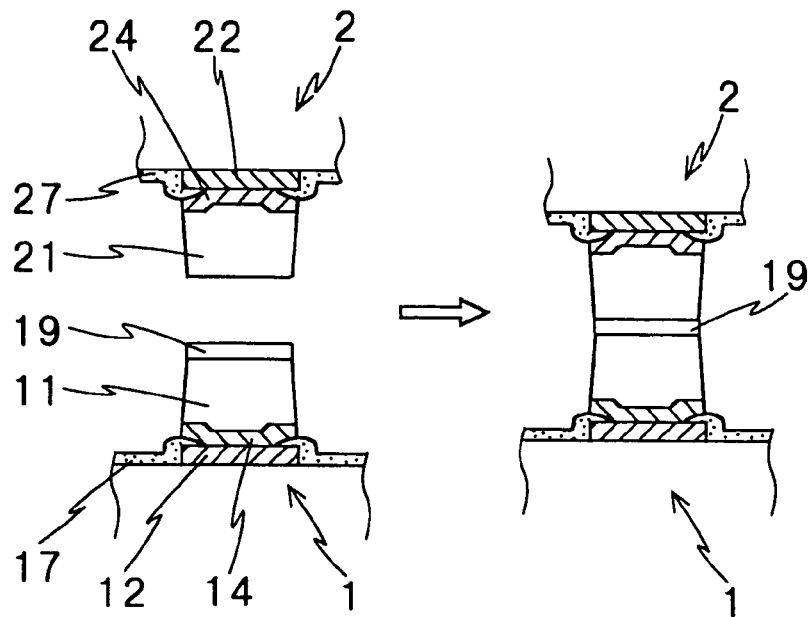
FIG. 12 is a cross-sectional view for showing a main part of an additional embodiment of the semiconductor device of the present invention.

In FIG. 12, the same components with FIG. 1 are indicated by the same reference numerals and their explanation is omitted. The bump electrode 11 provided on the barrier metal layer 14 of the first semiconductor chip 1 is made of, for example, Ni and has at the joining portion on its right surface a low-melting point alloy layer such as an Au—Sn eutectic alloy (with a ratio of, e.g., Au:Sn=80:20) as a third metal layer 19 formed to a thickness of, for example, 0.5 to 3.0 μm or so. This Au—Sn layer 19 is formed to such a thickness by sputtering, electroless plating, etc.

The semiconductor chip 1 provided with the Au—Sn layer 19 on the bump electrode 11 can be joined with the second semiconductor chip 2 by, like in the case of the above-mentioned example shown in FIGS. 1A and 1B, putting the first semiconductor device 1 on, for example, a board stage which can be heated and aligning it with the second semiconductor chip 2 superposing the second semiconductor chip 2 thereon with a mounter in such a manner as to align their respective bumps with each other and then heating them to a temperature of 300° C. or so under pressure so that the Au—Sn alloy layer 19 may melt and diffuse into Ni of the bump electrodes 11 and 21 to thereby form an intermetallic compound for so-called diffusive joining. Note here that as mentioned above, in an Au—Sn alloy, Au is at least 10 times as large as Sn in diffusion coefficient.

In this construction, since the bump electrode surface and the Au—Sn alloy layer are intermetallic bonded with each other, they are securely joined to each other at a solder reflow temperature of 260° C. or so during the assembling of the semiconductor device. At the central portion, on the other hand, the Au—Sn alloy layer in an Au—Sn alloyed state and, therefore, melts near a temperature of 300° C. or so but is small in layer thickness, so that it is not peeled off during solder reflowing because it is in the packaged semiconductor device unless an external force is applied on the semiconductor chips. If an external force is applied on it at a high temperature of 300° C. or so, the low-melting point alloy layer melts and, therefore, can be peeled off easily. As such, for example, to replace the second semiconductor chip with a new one, by heating it nearly to a temperature of 280-300° C. and applying an external force thereon, it can be easily separated, thus giving a merit of easy replacement of the semiconductor chip. Note here that the thickness of the Au—Sn alloy layer can be adjusted so that it may not easily peeled off at around a temperature of 300° C.

Also, as mentioned above, by providing an Sn coating on the metal surface made of Au, for example, and heating them to a temperature of 280° C. or so beforehand, almost the same construction can be provided as that with a case where an Au—Sn alloy layer is provided on the Au bump electrode surface, so that another bump electrode etc. to be joined can be brought into contact with that surface and then heated for liquid-phase diffusion.

Although the above-mentioned examples have employed Ni as the material of the bump electrodes, Al etc. may be used to thereby diffuse the Au—Sn alloy for diffusive joining similarly. Further, in the construction employed in the above-mentioned examples, the Sn coating may be replaced by an Au—Sn alloy layer. In this case, since Au and the Au—Sn alloy are both Au—based, when the Au—Sn alloy melts, it joins to the Au surface as wetted. That is, although the example shown in FIG. 12 has formed the bump electrodes 11 and 21 on the semiconductor chips 1 and 2 respectively, such a construction may be possible that one of these chips has a bump electrode and the other has an electrode terminal or a portion of wiring or that even if these chips are interconnected at their respective portions of wiring, their respective joining portions are joined to each other by use of an Au—Sn alloy.

Figure 16:
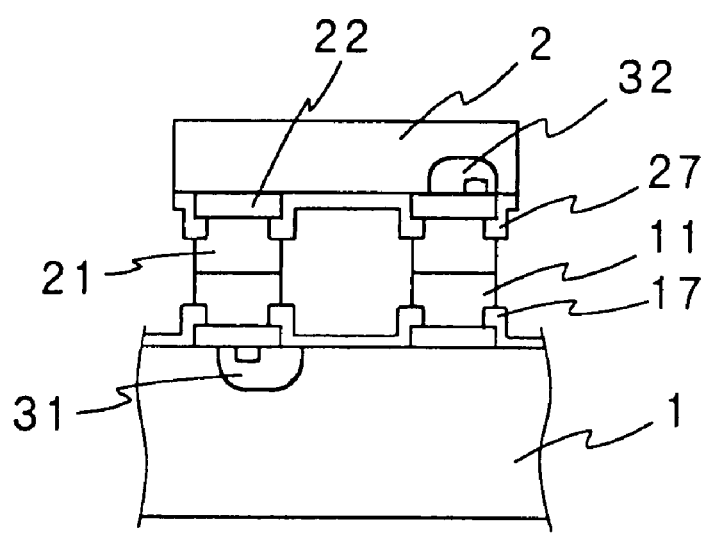
FIG. 16 is a conceptual diagram for showing an example of forming a circuit element also at a semiconductor layer underlying the joining portion according to the present invention.
Figure 17:
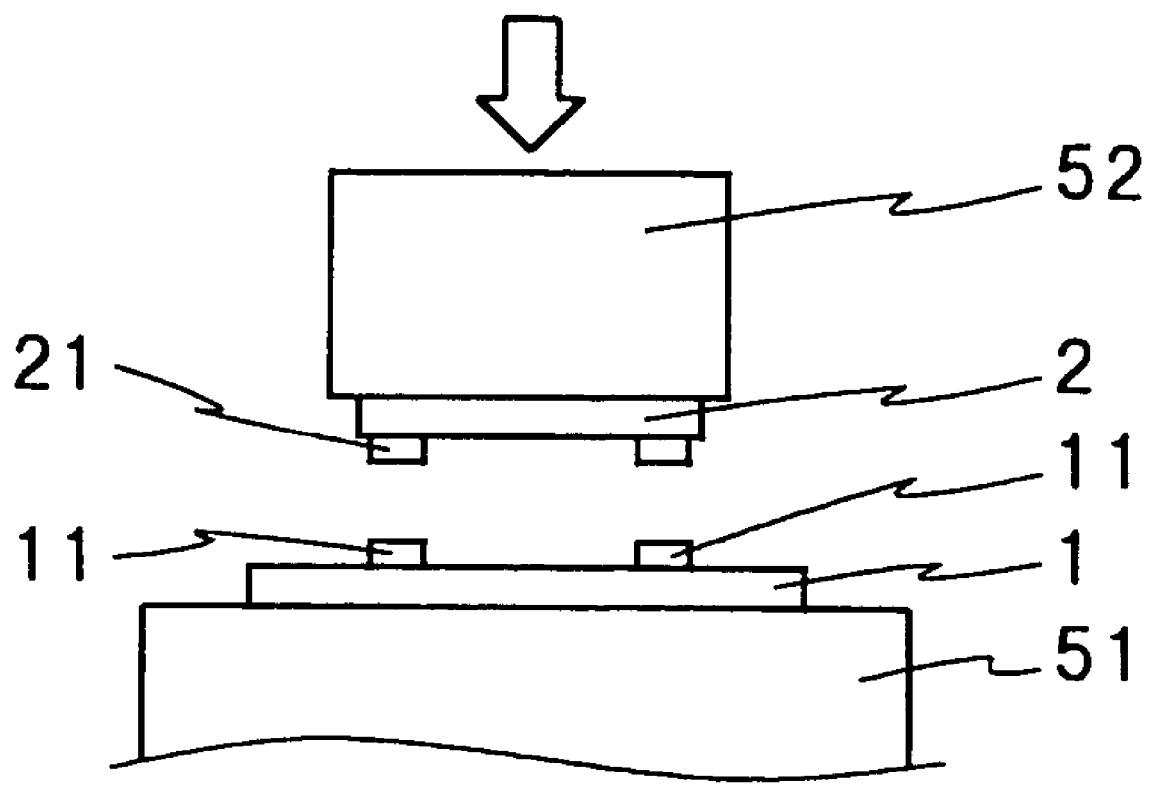
FIG. 17 is an illustration for showing an example of a related art process for interconnecting the chips.

By the present invention, it is possible to join the chips to each other without applying so large load due to the use of supersonic waves during the joining, and also at a relatively low temperature. Accordingly, the semiconductor layers are damaged little, to make it possible to form the circuit elements 31 and 32 also under the joining portion (where the bump electrodes or wirings are formed) as shown in FIG. 16. As a result, the semiconductor chips can be utilized very effectively in area, thus improving the integration density. Although the circuit elements 31 and 32 appear to be in direct contact with the electrode terminal in FIG. 16, typically they are separated from it by an insulating film or partially connected thereto. In FIG. 16, the same components with FIG. 1 are indicated by the same reference numerals and their explanation is omitted. Note here that it is not necessary to form the circuit element in a semiconductor layer under the joining portion on both of the semiconductor chips nor at all of the joining portions.

Although the above-mentioned examples employed the semiconductor device having such a construction that the semiconductor chips 1 and 2 are bonded to each other only in a one-to-one relationship, the same effects can be obtained in such a construction that a plurality of semiconductor chips 2 is bonded to one semiconductor chip 1. Also, they can be simply joined to each other at a relatively low temperature if one of them is a board and the other is a semiconductor chip.

As described above, by the present invention, it is unnecessary to heat the chips in a COC type semiconductor device to a high temperature when joining them to each other, to thereby avoid affecting the circuit elements formed on the semiconductor substrate, thus greatly improving the reliability of these elements.

Further, since these semiconductor chips are joined to each other via a metal layer which can be easily separated at a temperature of 300° C. or less, even in the case of replacing one of these chips, they are not heated to such an extent that they may be damaged, thus facilitating the replacement greatly.

Also, when connecting one semiconductor chip to the wiring portion provided on the outermost surface of a passivation film (insulator film) of the other semiconductor chip, the wiring portion can be flattened by interposing an insulating layer between itself and the passivation film, thus facilitating and securing the connection. In this case, another insulating layer can be interposed between the opposing wiring portions of the respective semiconductor chips to be joined to each other, thus further stabilizing the joining.

Further, by filling the gap between the semiconductor chips to be joined to each other with an insulating material having nearly the same elastic modulus as that of the bump electrodes or an insulating resin having a shrinkage factor of 4% or less, the stress is not concentrated to the semiconductor layer at the joining portion of the electrode terminal but dispersed all over the surfaces thereof, thus improving the reliability of the semiconductor chips.

INDUSTRIAL APPLICABILITY

By the present invention, it is possible to improve the reliability of a composite semiconductor device in which its semiconductor circuits are comprised of a plurality of chips like in the case of a combination of, for example, memory elements and the corresponding driver circuits, thus accommodating the requirements for miniaturization and higher functioning of the semiconductor devices.

What is claimed is:

1. A method for manufacturing a semiconductor device, in which a first semiconductor chip or substrate and a second semiconductor chip are joined to each other face-to-face via gold bumps provided on electrode terminals or wiring of the first semiconductor chip or substrate and gold bumps provided on the second semiconductor chip, each of the bumps provided on electrode terminals or wiring of the first semiconductor chip or substrate and the bumps provided on the second semiconductor chip having a substantially flat end, said method comprising the steps of:

providing a tin layer on a whole surface, including a surface of the flat end and a side face of each of the gold bumps, of at least one of the first semiconductor chip or substrate and second semiconductor chip, the tin layer having a thickness of about 0.1 to about 4 μm and each of the gold bumps having a thickness of about 10 μm to about 30 μm;

superposing the first semiconductor chip or substrate and the second semiconductor chip without perfect alignment between the bumps thereof, the end of the first bump facing the end of the second bump;

heating the first semiconductor chip or substrate and the second semiconductor chip to a temperature at which the tin layer melts, to thereby self-align the first semiconductor chip or substrate and the second semiconductor chip and join them to each other via Au—Sn alloy layers having a thickness of about 0.8 μm to about 5 μm and filling an insulating resin into a gap between the first semiconductor chip or substrate and the second semiconductor chip after they are joined, the insulating resin having a thermal shrinkage factor of 4% or less, wherein the end of one of the first and second bumps has an area smaller than the end of the other of the first and second bumps, and a fillet of the metal having a lower melting point forms during the heating step and covers at least part of a side wall of the first or second bump with the end having the smaller area.

2. The method according to claim 1, wherein the heating step comprises:

liquefying the tin to thereby diffuse gold of the first and second bumps into the tin.

3. The method according to claim 1, wherein the insulating resin and the first and second bumps have approximately the same elastic modulus.

* * * * *